(12) United States Patent
Hatanaka et al.

(10) Patent No.: US 6,927,012 B2
(45) Date of Patent: Aug. 9, 2005

(54) POLYAMIC ACID RESIN COMPOSITION

(75) Inventors: Tadashi Hatanaka, Chiba (JP); Sahade Daniel Antonio, Chiba (JP); Takayasu Nihira, Chiba (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 59 days.

(21) Appl. No.: 10/484,719

(22) PCT Filed: Jul. 15, 2002

(86) PCT No.: PCT/JP02/07178

§ 371 (c)(1),
(2), (4) Date: Jan. 26, 2004

(87) PCT Pub. No.: WO03/011974

PCT Pub. Date: Feb. 13, 2003

(65) Prior Publication Data

US 2004/0175646 A1 Sep. 9, 2004

(30) Foreign Application Priority Data

Jul. 26, 2001 (JP) ........................................ 2001-225817

(51) Int. Cl.[7] ............................................... G03F 7/004
(52) U.S. Cl. ................................. 430/270.1; 430/281.1; 430/283.1; 430/5; 430/311; 430/330; 522/173; 522/420; 522/454
(58) Field of Search ............................ 430/270.1, 281.1, 430/283.1, 5, 311, 330; 522/173, 420, 454

(56) References Cited

U.S. PATENT DOCUMENTS

| | | | | |
|---|---|---|---|---|
| 4,339,521 A | * | 7/1982 | Ahne et al. | 430/192 |
| 4,851,506 A | | 7/1989 | Rohde et al. | |
| 5,122,439 A | * | 6/1992 | Miersch et al. | 430/311 |
| 5,206,117 A | * | 4/1993 | Labadie et al. | 430/325 |
| 5,288,588 A | | 2/1994 | Yukawa et al. | |
| 5,449,705 A | * | 9/1995 | Watanabe et al. | 522/148 |
| 5,585,217 A | * | 12/1996 | Oba | 430/191 |
| 5,753,407 A | * | 5/1998 | Oba | 430/191 |
| 5,756,650 A | * | 5/1998 | Kawamonzen et al. | 528/353 |
| 5,817,441 A | | 10/1998 | Iwata et al. | |
| 6,489,431 B1 | | 12/2002 | Ishii et al. | |
| 6,541,178 B2 | * | 4/2003 | Jung et al. | 430/270.1 |
| 6,599,675 B2 | * | 7/2003 | Kamada et al. | 430/270.1 |
| 6,600,006 B2 | * | 7/2003 | Jung et al. | 528/353 |
| 6,677,099 B1 | | 1/2004 | Ishii et al. | |
| 2002/0048719 A1 | * | 4/2002 | Jung et al. | 430/270.1 |
| 2002/0182536 A1 | * | 12/2002 | Kamada et al. | 430/270.1 |

FOREIGN PATENT DOCUMENTS

| | | |
|---|---|---|
| EP | 1 241 527 | 9/2002 |
| JP | 2-225522 | 9/1990 |
| JP | 7-228838 | 8/1995 |
| JP | 8-239470 | 9/1996 |
| JP | 10-20114 | 1/1998 |
| JP | 10-020114 | 1/1998 |
| JP | 10-197715 | 7/1998 |
| JP | 10-197875 | 7/1998 |
| JP | 2000-187111 | 7/2000 |
| JP | 2001-183516 | 7/2001 |
| WO | 02/29494 | 4/2002 |

* cited by examiner

Primary Examiner—Amanda C. Walke
(74) Attorney, Agent, or Firm—Oblon, Spivak, McClelland, Maier & Neustadt, P.C.

(57) ABSTRACT

Provided is a polyamic acid resin composition for formation of a bank, which provides excellent film characteristics and adhesion to a substrate, which can undergo patterning with use of a positive type photoresist, and which can be transformed into a polyimide after the patterning to yield a polyimide resin with upper part of film having a low surface energy. It is achieved by a polyamic acid resin composition comprising a polyamic acid [a] as a base and a polyamic acid [b] having a fluorine-containing alkyl group with a carbon number of at least 2, and containing the polyamic acid [b] in an amount of from 0.1 to 30 wt % to the total amount of the polyamic acid [a] and the polyamic acid [b].

13 Claims, No Drawings

POLYAMIC ACID RESIN COMPOSITION

TECHNICAL FIELD

The present invention relates to a polyamic acid resin composition for formation of a bulkhead to separate pixels from each other in liquid crystal displays, EL displays, and the like. More particularly, the present invention relates to a polyamic acid resin composition capable of forming a polyamic acid resin film, followed by patterning thereof with use of a positive type photoresist, and thereafter being imidized to obtain a polyimide resin bulkhead with a low surface energy property.

This polyamic acid resin composition is suitable for use as a light shielding material and a bulkhead material adapted to the ink jet method, in the liquid crystal displays and EL displays.

Display apparatus for various displays using liquid crystal display devices or organic EL display devices, has achieved remarkable development thanks to its excellent properties of small size, light weight, and low electric power consumption.

In recent years, lively investigation has been made on manufacturing technologies using the ink jet method in production of these displays. For example, for producing a color filter in the liquid crystal display device, a method proposed is a color filter production process wherein a preliminarily patterned bulkhead (hereinafter referred to as a "bank") to define pixels is made of a light-shielding photosensitive resin layer and ink droplets are dropped into each aperture enclosed with the bank, in contrast to the conventional printing method, electrodeposition method, staining method, or pigment-dispersion method. Furthermore, in the case of the organic EL display devices, a proposal was also made on a method for production of the organic EL display devices wherein the bank was preliminarily formed and ink droplets were dropped similarly to form luminescent layers.

In dropping the ink droplets into the apertures enclosed with the bank by the ink jet method, in order to prevent the ink droplets from flowing over the bank into adjacent pixels, it is necessary to provide a substrate with affinity for ink and the surface of the bank with ink repellency. Furthermore, if the side face of the bank has too high ink repellency, there will also arise the problem that the ink layers become too thin in the vicinity of the bank.

JP-A-2000-187111 suggests a method of preparing the bank material in a laminated structure of a metal film and a photosensitive organic thin film, and blending a fluorochemical surfactant and a fluorinated polymer except for polyimides into the photosensitive organic thin film, so as to make the surface of the photosensitive organic thin film have a low surface energy; and a method of performing a continuous plasma treatment with oxygen gas and with fluoride gas to provide the substrate with affinity for ink and the bank with ink repellency. However, the method of blending the fluorochemical surfactant and the fluorinated polymer except for polyimides into the photosensitive organic thin film involved many points to be considered, including compatibility and amounts to be added, as well as both photosensitivity and film characteristics, and the method of performing the continuous plasma treatment required complicated steps; therefore, they were hardly practical.

The present invention has been accomplished under the above circumstances, and it is an object of the present invention to provide a polyamic acid resin composition, which provides excellent film characteristics and adhesion to a substrate, which can undergo patterning with use of a positive type photoresist, and which can be transformed into a polyimide after the patterning to yield a polyimide resin with upper part of film having a low surface energy.

DISCLOSURE OF THE INVENTION

The present inventors have conducted elaborate study to overcome the above problems, and, as a result, have accomplished the present invention.

Namely, the present invention provides a polyamic acid resin composition for formation of a bank, which comprises a polyamic acid [a] having repeating units represented by the following formula (1):

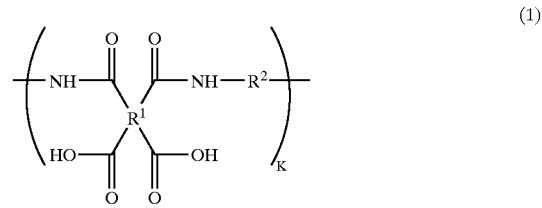

(wherein $R^1$ is a tetravalent organic group constituting a tetracarboxylic acid or a derivative thereof, $R^2$ is a bivalent organic group constituting a diamine, and k is an integer) and having a reduced viscosity of from 0.05 to 5.0 dl/g (in N-methylpyrrolidone at a temperature of 30° C., at a concentration of 0.5 g/dl); and a polyamic acid [b] having repeating units represented by the following formula (2):

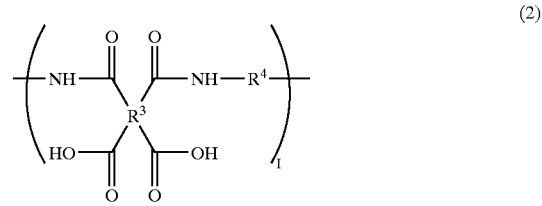

(wherein $R^3$ is a tetravalent organic group constituting a tetracarboxylic acid or a derivative thereof, $R^4$ is a bivalent organic group constituting a diamine, from 1 to 100 mol % of $R^4$ has one or more fluorine-containing alkyl groups with a carbon number of at least 2, and 1 is an integer), and having a reduced viscosity of from 0.05 to 5.0 dl/g (in N-methylpyrrolidone at a temperature of 30° C., at a concentration of 0.5 g/dl);

wherein the content of the polyamic acid [b] is from 0.1 to 30 wt % to the total amount of the polyamic acid [a] and the polyamic acid [b].

BEST MODE FOR CARRYING OUT THE INVENTION

Now, the present invention will be explained in detail.

The polyamic acid resin composition of the present invention is a composition comprising a polyamic acid [a] as a base and a polyamic acid [b] having a fluorine-containing alkyl group.

The polyamic acid [b] has the fluorine-containing alkyl group whereby it comes to have a low surface energy and to demonstrate the ink repellency in the form of the bank.

<Polyamic Acid [a]>

The polyamic acid [a], which is a component of the polyamic acid resin composition of the present invention, is a polyamic acid having repeating units represented by the above-stated formula (1).

Although there are no particular restrictions on a method of producing the polyamic acid, it can generally be obtained by reacting or polymerizing a diamine with a tetracarboxylic acid or its derivative, e.g. a tetracarboxylic dianhydride, or with a dicarboxylic acid dihalide, or the like. Furthermore, a method usually applicable is one of reacting or polymerizing a diamine with a tetracarboxylic dianhydride (hereinafter abbreviated to "acid dianhydride"), in a polar solvent such as N-methylpyrrolidone.

There are no particular restrictions on the diamine used for obtaining the polyamic acid [a], and it is possible to use a single diamine, or to use two or more diamines simultaneously.

Particularly, specific examples of the diamine include p-phenylenediamine, m-phenylenediamine, 4,4-methylene-bis(2,6-ethylaniline), 4,4'-methylene-bis(2-isopropyl-6-methylaniline), 4,4'-methylene-bis(2,6-diisopropylaniline), 2,4,6-trimethyl-1,3-phenylenediamine, 2,4,5,6-tetramethyl-1,4-phenylenediamine, o-toluidine, m-toiuidine, 3,3', 5,5'-tetramethylbenzidine, bis[4-(3-aminophenoxy)phenyl]sulfone, 2,2-bis[4-(3-aminophenoxy)phenyl]propane, 2,2-bis[4-(3-aminophenoxy)phenyl]hexafluoropropane, 4,4'-diamino-33'-dimethyldicyclohexylmethane, 4,4'-diaminodiphenyl ether, 3,4-diaminodiphenyl ether, 4,4'-diaminodiphenylmethane, 2,2-bis(4-anilino)hexafluoropropane, 2,2-bis(3-anilino)hexafluoropropane, 2,2-bis(3-aniino-4-toluyl)hexafluoropropane, 1,4-bis(4-aminophenoxy)benzene, 1,3-bis(4-aminophenoxy)benzene, bis[4-(4-aminophenoxy)phenyl]sulfone, 2,2-bis[4-(4-aminophenoxy)phenyl]propane and 2,2-bis[4-(4-aminophenoxy)phenyl]hexafluoropropane.

Furthermore, in order to increase the adhesion to the substrate, it is also preferable to use a diamine containing siloxane.

Specific examples of the siloxane-containing diamine are as follows:

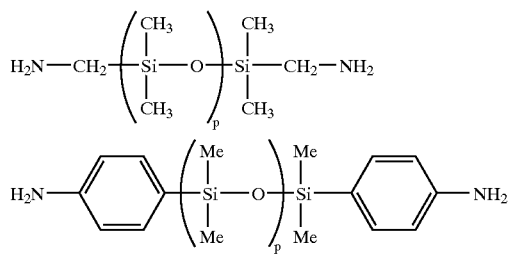

(wherein p is an integer from 1 to 10).

There are no particular restrictions on the acid dianhydride applicable for obtaining the polyamic acid [a], and it is possible to use a single acid dianhydride, or to use two or more acid dianhydrides simultaneously.

Particularly, specific examples of the acid dianhydride include aromatic tetracarboxylic dianhydrides such as pyromellitic dianhydride, 3,3',4,4'-biphenyltetracarboxylic dianhydride, 3,3',4,4'-benzophenonetetracarboxylic dianhydride, 3,3',4,4'-diphenyl ether tetracarboxylic dianhydride, 2,2-bis(3,4-dicarboxyphenyl)hexafluoropropane dianhydride, and 3,3',4,4'-diphenyl sulfone tetracarboxylic dianhydride.

Further specific examples of the acid dianhydride include alicyclic tetracarboxylic dianhydrides such as 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalenesuccinic dianhydride, 2,3,5-tricarboxy-2-cyclopentaneacetic dianhydride, bicyclo[2.2.2]oct-7-ene-2,3,5,6-tetracarboxylic dianhydride, 2,3,4,5-tetrahydrofurantetracarboxylic dianhydride, and 3,5,6-tricarboxy-2-norbornaneacetic dianhydride, and aliphatic tetracarboxylic dianhydrides such as 1,2,3,4-butanetetracarboxylic dianhydride.

In view of solubility of the polyamic acid resin film to an alkali developer, the acid dianhydride is preferably one comprised of a tetracarboxylic acid wherein the four carbonyl groups are not directly bonded to an aromatic ring, such as 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalenesuccinic dianhydride, 2,3,5-tricarboxy-2-cyclopentaneacetic dianhydride, bicyclo[2.2.2]oct-7-ene-2,3,5,6-tetracarboxylic dianhydride, 2,3,4,5-tetrahydrofurantetracarboxylic dianhydride, and 3,5,6-tricarboxy-2-norbornaneacetic dianhydride, and is more preferably 1,2,3,4-cyclobutanetetracarboxylic dianhydride.

On the occasion of the polymerization of the polyamic acids, a ratio of the total mole of the diamine and that of the tetracarboxylic dianhydride is preferably from 0.8 to 1.2.

The closer to 1 the molar ratio, the higher the polymerization degree of the polymer to be produced, as being the case in ordinary condensation polymerization reaction. If the polymerization degree is too low, the strength of the film will be inadequate. If the polymerization degree is too high, workability during formation of the film will be poor in certain cases. Accordingly, the polymerization degree of the product in the present invention is preferably such that the reduced viscosity is from 0.05 to 5.0 dl/g (in N-methylpyrrolidone at a temperature of 30° C., at a concentration of 0.5 g/dl). The above reduced viscosity is particularly preferably from 0.2 to 2.0 dl/g in the above range.

Specific examples of the polar solvent applicable in reacting the diamine with the acid dianhydride in the polar solvent include N,N-dimethylformamide, N,N-dimethylacetamide, N-methylpyrrolidone, N-vinylpyrrolidone, N-methylcaprolactam, dimethylsulfoxide, tetramethylurea, pyridine, dimethylsulfone, hexamethylsulfoxide, m-cresol, and γ-butyrolactone. They may be used alone or as a mixture. Furthermore, it is also possible to use a solvent that does not dissolve the polyamic acid if it is used as mixed in the above solvent within a range in which the polyamic acid formed by the polymerization does not precipitate.

Furthermore, the diamine is reacted with the acid dianhydride at a reaction temperature optionally selected from the range of from −20 to 150° C., and preferably from the range of from −5 to 100° C.

The polyamic acid thus obtained can be used as it is, or can be used after a process of precipitating and isolating the polyamic acid in a poor solvent such as methanol, ethanol, or the like, and collecting it.

<Polyamic Acid [b]>

The polyamic acid [b], which is a component of the polyamic acid resin composition of the present invention, is a polyamic acid having repeating units represented by the above formula (2).

There are no specific restrictions on a method for producing the polyamic acid, and it can be obtained in much the same manner as the above polyamic acid [a] was.

The reduced viscosity of the polyamic acid [b] is preferably in a range of from 0.05 to 5.0 dl/g (in N-methylpyrrolidone at a temperature of 30° C., at a concentration of 0.5 g/dl), for the same reason as that of the polyamic acid [a], and more preferably in a range of from 0.1 to 1.5 dl/g. In this connection, if the reduced viscosity of the polyamic acid [b] is set to be smaller than that of the polyamic acid [a], the polyamic acid [b] tends to be locally distributed more in the vicinity of the surface of the film formed from the polyamic acid resin composition of the present invention, which is more preferable.

The diamine used for obtaining the polyamic acid [b] may be a single diamine or be two or more diamines used simultaneously, but it is necessary to use at least one diamine having a fluorine-containing alkyl group with a carbon number of at least 2, in order to impart the low surface energy property to the polyamic acid [b].

There are no specific restrictions on the diamine having the fluorine-containing alkyl group with the carbon number of at least 2, and the diamine may be preferably a diamine having a fluorine-containing alkyl group with a carbon number of at least 6, and more preferably a diamine having a fluorine-containing alkyl group with a carbon number of from 8 to 20. The number of fluorine-containing alkyl groups can be one or more per diamine.

Generally, with increase in the number of carbon atoms in the fluorine-containing alkyl group, and with increase in the number of fluorine-containing alkyl groups per diamine, the effect of lowering the surface energy becomes more significant.

Specific examples of the diamine having the fluorine-containing alkyl group with the carbon number of at least 2 include diamines having the fluorine-containing alkyl group, such as 4-trifluoroethyl-1,3-diaminobenzene, 4-perfluorohexyl-1,3-diaminobenzene, 4-perfluorooctyl-1,3-diaminobenzene, 4-perfluorodecyl-1,3-diaminobenzene, 5-(2,2,3,3,3-pentafluoropropyl-1-oxymethyl)-1,3-diaminobenzene, 5-(1H,1H,2H,2H-heptadecafluorodecyl-1-oxymethyl)-1,3-diaminobenzene, 4-perfluorodecyl-1,3-diaminobenzene, 2,2,3,3,3-pentafluoropropyl-3,5-diaminobenzoate, 1H,1H,2H,2H-heptadecafluorodecyl-3,5,-diaminobenzoate, and 4-(4-perfluorooctylphenoxy)-1,3-diaminobenzene. However, the present invention is not limited to those.

The diamine used for obtaining the polyamic acid [b] may be only the diamine having the fluorine-containing alkyl group with the carbon number of at least 2, and may contain another diamine as mixed thereto. In this case, the amount of the diamine having the fluorine-containing alkyl group with the carbon number of at least 2 is preferably from 1 to 100 mol % relative to the total mols of all the diamines used, and particularly preferably from 25 to 75 mol %. If the amount of the diamine having the fluorine-containing alkyl group with the carbon number of at least 2 is less than 1 mol %, the effect of reducing the surface energy might be inadequate in some cases. In addition, when the other diamine is mixed in an amount of at least 25 mol %, it is expected to enhance the compatibility of the polyamic acid [b] with the polyamic acid [a] in a solution state and the stability of the polyamic acid resin composition of the present invention.

There are no specific restrictions on the above "other diamine," and specific examples thereof correspond to the specific examples of the diamine that can be used for obtaining the polyamic acid [a].

There are no specific restrictions on the acid dianhydride used for obtaining the polyamic acid [b], and it is possible to use a single acid dianhydride, or to use two or more acid dianhydrides simultaneously.

Particularly, specific examples of the acid anhydride correspond to the specific examples of the acid dianhydrides that can be used for obtaining the polyamic acid [a]. Namely, just as in the case of the polyamic acid [a], from the viewpoint of the solubility of the polyamic acid resin film to the alkali developer, the acid dianhydride is preferably one comprised of a tetracarboxylic acid wherein the four carbonyl groups are not directly bonded to an aromatic ring, such as 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalenesuccinic dianhydride, 2,3,5-tricarboxy-2-cyclopentaneacetic dianhydride, bicyclo[2.2.2]oct-7-ene-2,3,5,6-tetracarboxylic dianhydride, 2,3,4,5-tetrahydrofurantetracarboxylic dianhydride, or 3,5,6-tricarboxy-2-norbornaneacetic dianhydride, and is more preferably 1,2,3,4-cyclobutanetetracarboxylic dianhydride.

<Polyamic Acid Resin Composition>

The polyamic acid resin composition of the present invention contains the aforementioned polyamic acid [a] and polyamic acid [b], and is usually used in the form of a solution in which the composition is dissolved in an organic solvent.

There are no specific restrictions on the above organic solvent as long as the polyamic acid [a] and the polyamic acid [b] can be dissolved uniformly therein.

Specific examples of the solvent include N,N-dimethylformamide, N,N-dimethylacetamide, N-methylpyrrolidone, N-vinylpyrrolidone, N-methylcaprolactam, dimethylsulfoxide, tetramethylurea, pyridine, dimethylsulfone, hexamethylsulfoxide, m-cresol, and γ-butyrolactone.

Furthermore, depending on objectives such as the coating property and the printing property onto the substrate, the storage stability, and the like, another organic solvent may be mixed unless it inhibits the dissolution of the resin components. Specific examples of the additional organic solvent include ethyl cellosolve, butyl cellosolve, ethyl carbitol, butyl carbitol, ethyl carbitol acetate, butyl carbitol acetate, ethylene glycol, ethyl lactate, butyl lactate, cyclohexanone, and cyclopentanone.

There are no specific restrictions on the resin concentration in the solution as long as the resin is uniformly dissolved in the organic solvent, and it is preferably in a range of from 1 to 50 wt % from the viewpoint of tractability.

Although the compounding ratio of the polyamic acid [a] and the polyamic acid [b] can be optionally selected for controlling the surface energy of the film, it is limited in the polyamic acid resin composition of the present invention for the following reasons.

With use of only the polyamic acid [a], the surface energy of the bank formed thereof will not be low enough, so that the ink repellency will be inadequate. On the other hand, with use of only the polyamic acid [b], the adhesion to the substrate might be inadequate, and the side face of the bank will also have the surface energy too low to secure a sufficient coating property of ink on the side face of the bank in some cases.

When a film is formed from the solution of the resin composition containing the polyamic acid [a] and the polyamic acid [b], the polyamic acid [b] having the low surface energy is locally distributed in the vicinity of the surface of the film. When this film is subjected to etching to form a bank, the resultant bank has a low surface energy only in the upper part.

At this time, if the compounding amount of the polyamic acid [b] is too small, the upper part of the bank will fail to have a sufficiently low surface energy; whereas if the compounding amount is too large, even the side face of the bank will have a low surface energy as well.

Accordingly, the content of the polyamic acid [b] in the polyamic acid resin composition of the present invention is from 0.1 to 30 wt %, preferably from 0.1 to 10 wt. %, and more preferably from 0.1 to 5 wt %, to the total amount of the polyamic acid [a] and the polyamic acid [b].

If the content of the polyamic acid [b] is too large, the coating property of the solution will become poor in some cases.

The polyamic acid resin composition of the present invention can be obtained by mixing the aforementioned polyamic acid [a] and polyamic acid [b] in an organic solvent, or by mixing solutions of the respective polyamic acids [a] and [b].

For forming the bank from the polyamic acid resin composition of the present invention, the solution is first applied onto a substrate, such as an ITO film-coated glass substrate, a $SiO_2$-coated glass substrate, or a Cr film-coated glass substrate, by spin coating, and preliminary drying is conducted at a temperature of from 50 to 130° C. to form a film. On this occasion, it is, of course, preferable to use a substrate treated with a silane-based coupling agent.

Then the pre-dried film is baked again at an appropriate temperature to control alkali solubility (called β-bake); a positive type resist is applied onto the film; light is irradiated onto the film through a mask having a predetermined pattern; the resist and film are developed with an alkali developer, whereby not only the exposed part of the resist but also the exposed part of the polyamic acid resin are washed out to leave a relief pattern with a sharp end face.

The temperature of the β-bake is an appropriate temperature generally selected in a range of from 150° C. to 200° C., depending on the structures of the polyamic acids. If the β-bake temperature is too high, the alkali solubility will be insufficient in the exposed part of the polyamic acid resin. If the β-bake temperature is too low, the polyamic acid resin will also be dissolved in the unexposed part. Thus the temperature setting outside the above temperature range will fail to obtain a good relief pattern in either case.

The positive type photoresist may be any commercially available photoresist that is sensitive to the i-line or the g-line, with no particular restrictions.

A light source used is generally a very high pressure mercury lamp, and a spectroscopic filter is interposed between the light source and the mask to implement spectral irradiation with the i-line (365 nm), the h-line (405 nm), the g-line (436 nm), or the like. The film obtained from the polyamic acid resin composition of the present invention can be patterned with light of either of these wavelengths.

Furthermore, a method for transferring the mask pattern onto the film can, for example, be contact exposure with a contact aligner, proximity exposure, reduction projection exposure with a stepper.

The developer used in the development may be any alkali aqueous solution, and specific examples thereof include aqueous solutions of alkali metal hydroxides such as caustic potash, and caustic soda, aqueous solutions of quaternary ammonium hydroxides such as tetramethylammonium hydroxide, tetraethylammonium hydroxide, and choline, and solutions of amines such as ethanolamine, propylamine, ethylenediamine. In addition, a surfactant can be added into the developer.

These developers can be used at from 5 to 50° C., and the film obtained from the polyamic acid resin composition of the present invention has a high solubility in the exposed part and can readily be developed at room temperature with 2.38 wt % general-purpose tetramethylammonium hydroxide.

The resist remaining on the unexposed portion can be easily removed by immersing it in the solvent used for dissolving the resist. Particularly, specific typical examples of the solvent include propylene glycol, propylene glycol monoethyl ether, 2-heptane, cyclohexanone.

The substrate with the relief pattern obtained as described above, is subjected further to a heat treatment at from 200° C. to 300° C. to complete imidization, thereby obtaining a satisfactory bank having the low surface energy only in the upper part and having excellent heat resistance, chemical resistance, and electrical characteristics, which are the characteristics of polyimide.

In order to impart the satisfactory ink repellency to the upper part of the bank obtained as described above, after the removal of the resist in the unexposed part and the thermal imidization, the upper part of the film has the surface energy of preferably at most 35 dyn/cm, and particularly preferably at most 30 dyn/cm; or it has the contact angle with water of preferably at least 80°, and particularly preferably at least 95°.

In view of the affinity to the alkali developer on the occasion of the development after the exposure, the above surface energy is preferably at least 10 dyn/cm, and the contact angle with water is preferably at most 150°.

Now, the present invention will be described in further detail with reference to Examples. However, it should be understood that the present invention is by no means restricted by such specific Examples.

EXAMPLE 1

Production of Polyamic Acid Resin Composition 10.00 g (34.2 mmol) of 1,3-bis(4-aminophenoxy)benzene, 0.44 g (1.8 mmol) of 1,3-bis(3-aminopropyl)-1,1,3,3-tetramethyldisiloxane, and 7.06 g (36.0 mmol) of 1,2,3,4-cyclobutanetetracarboxylic dianhydride were made to react in 96.6 g of N-methylpyrrolidone (hereinafter abbreviated to NMP in some cases) at room temperature for six hours, to obtain a solution of a polyamic acid [a-1] having a number average molecular weight of 40,000 (k=82 as repeating units). The reduced viscosity of the polyamic acid was 1.0 dl/g (in N-methylpyrrolidone at a temperature of 30° C., at a concentration of 0.5 g/dl).

Furthermore, 1.20 g (4.1 mmol) of 1,3-bis(4-aminophenoxy)benzene, 1.10 g (2.0 mmol) of 4-(4-perfluorooctylphenoxy)-1,3-diaminobenzene, and 1.20 g (6.1 mmol) of 1,2,3,4-cyclobutanetetracarboxylic dianhydride were made to react in 19.8 g of N-methylpyrrolidone (hereinafter abbreviated to NMP) at room temperature for six hours, to obtain a solution of a polyamic acid [b-1] having a number average molecular weight of 10,000 (l=17 as repeating units). The reduced viscosity of the polyamic acid was 0.4 dl/g (in N-methylpyrrolidone at a temperature of 30° C., at a concentration of 0.5 g/dl).

0.2 g of the solution of the above polyamic acid [b-1] (solid content ratio=99:1) was added into 20 g of the solution of the above polyamic acid [a-1] and 5.0 g of NMP was further added thereinto to dilute the solution to a resin concentration of 12%. This solution was stirred at room temperature for one hour to obtain a uniform solution. The resultant mixture was filtered by a 0.4 μm filter to obtain a solution of the polyamic acid resin composition of the present invention.

(Pattern Formation)

This polyamic acid resin solution was directly applied onto an $SiO_2$-coated glass substrate by means of a spin coater, and the substrate was heated at 90° C. on a hot plate for three minutes, thereby obtaining a uniform film 2.3 μm thick. Then the substrate was subjected to the β-bake at 170° C. on the hot plate for three minutes, and a positive type photoresist for the g-line S-1808 (manufactured by SHIPLEY Company) was applied up to a film thickness of 1.0 μm. This film was exposed through a test mask to entire ultraviolet light at a dose of 1000 mJ/cm² by an ultraviolet irradiation system (PLA-501 manufactured by Canon Inc.). After the exposure, the substrate was immersed in an alkali developer (NMD-3 manufactured by TOKYO OHKA KOGYO CO., LTD) at 23° C. for 20 seconds to effect development, followed by a rinse with pure water for 20 seconds. After the resist was removed, it was confirmed that a pattern was formed in the unexposed portions. The pattern resolution was such that the line-and-space pattern was formed without peeling up to the width of 10 μm. The film thus obtained was heated at 250° C. in a circulating drying furnace for one hour, thereby obtaining a polyimide pattern 2.0 μm thick.

(Evaluation of Surface Energy)

The polyamic acid resin solution was directly applied onto an $SiO_2$-coated glass substrate by the spin coater, and the substrate was heated at 90° C. on the hot plate for three minutes, thereby obtaining a uniform film 2.3 μm thick. Then the substrate was subjected to the β-bake at 170° C. on the hot plate for three minutes, and the positive type photoresist for the g-line S-1808 (manufactured by SHIPLEY Company) was applied up to a film thickness of 1.0 μm. A half of the film was exposed through a mask to entire ultraviolet light at a dose of 1000 mJ/cm² by the ultraviolet irradiation system (PLA-501 manufactured by Canon Inc.). After the exposure, the substrate was immersed in the alkali developer (NMD-3 manufactured by TOKYO OHKA KOGYO CO., LTD) at 23° C. for 20 seconds to effect development, followed by a rinse with pure water for 20 seconds. After the resist was removed, the film thus obtained was heated at 250° C. for one hour in the circulating drying furnace, thereby obtaining a uniform polyimide film 2.0 μm thick. Contact angles with water and with methylene iodide on this film were measured and were 95° and 63°, respectively. Furthermore, the surface energy of the film was determined based on the following calculation.

$$(1+\cos\theta) \times \gamma_L = 2(\gamma_S^d \times \gamma_L^d)^{1/2} + 2(\gamma_S^p \times \gamma_L^p)^{1/2}$$

$$\gamma_L = \gamma_L^d + \gamma_L^p$$

$$\gamma_S = \gamma_S^d + \gamma_S^p$$

θ; contact angle of liquid on the film
$\gamma_L$; surface energy of liquid
$\gamma_L^d$; disperse component of surface energy of liquid
$\gamma_L^p$; polar component of surface energy of liquid
$\gamma_S$; surface energy of the film
$\gamma_S^d$; disperse component of surface energy of the film
$\gamma_S^p$; polar component of surface energy of the film.

Here, by letting the contact angle of water be $\theta_1$, and the contact angle of methylene iodide be $\theta_2$, and by putting the surface energies of water ($\gamma_L$=72.8, $\gamma_L^d$=29.1, $\gamma_L^p$=43.7) {dyn/cm} and the surface energies of methylene iodide ($\gamma_L$=50.8, $\gamma_L^d$=46.8, $\gamma_L^p$=4.0) {dyn/cm} into the above formulas, we obtain $$(1+\cos\theta_1) \times 72.8 = 2(\gamma_S^d \times 29.1)^{1/2} + 2(\gamma_S^p \times 43.7)^{1/2} \text{ and}$$

$$(1+\cos\theta_2) \times 50.8 = 2(\gamma_S^d \times 46.8)^{1/2} + 2(\gamma_S^p \times 4.0)^{1/2}.$$

Then $\theta_1$ and $\theta_2$ are replaced by measured values and the above simultaneous equations are solved to determine $\gamma_S^d$ and $\gamma_S^p$.

As a result, the surface energy of the film was 27.3 dyn/cm. Furthermore, the $SiO_2$ substrate in the exposed part had the contact angles with water and with methylene iodide of 40.7° and 6.9°, respectively, and the surface energy of 58.9 dyn/cm.

EXAMPLE 2

0.61 g of the solution of the polyamic acid [b-1] was added into 20 g of the solution of the polyamic acid [a-1] (solid content ratio=97:3), and 5.14 g of NMP was further added thereinto to dilute the solution to a resin concentration of 12%. This solution was stirred at room temperature for one hour to obtain a uniform solution. The mixture obtained was filtered by the 0.4 μm filter to obtain a solution of the polyamic acid resin composition of the present invention.

Using the solution of the polyamic acid resin composition prepared, a uniform film was formed in a thickness of 2.0 μm in conformity with Example 1. As a result of the same evaluation, the pattern resolution was such that the line-and-space pattern was formed without peeling up to the width of 10 μm. The contact angles of water and methylene iodide determined in conformity with Example 1 were 100° and 73.3°, respectively, and the surface energy was 21.3 dyn/cm.

EXAMPLE 3

1.41 g (4.8 mmol) of 1,3-bis(4-aminophenoxy)benzene, 3.00 g (5.6 mmol) of 4-(4-perfluorooctylphenoxy)-1,3-diaminobenzene, and 1.86 g (9.5 mmol) of 1,2,3,4-cyclobutanetetracarboxylic dianhydride were made to react in 35.5 g of NMP at room temperature for six hours, thereby obtaining a solution of a polyamic acid [b-2] having a number average molecular weight of 10,000 (l=17 as repeating units). The reduced viscosity of the polyamic acid was 0.4 dl/g (in N-methylpyrrolidone at a temperature of 30° C., at a concentration of 0.5 g/dl).

0.2 g of the above solution of the polyamic acid [b-2] was added into 20 g of the solution of the polyamic acid [a-1] in Example 1 (solid content ratio=99:1), and 5.0 g of NMP was further added thereinto to dilute the solution to a resin concentration of 12%. This solution was stirred at room temperature for one hour to obtain a uniform solution. The mixture obtained was filtered by the 0.4 μm filter to obtain a solution of the polyamic acid resin composition of the present invention.

Using the solution of the polyamic acid resin composition prepared, a uniform film was formed in a thickness of 2.0 μm in conformity with Example 1. As a result of the same evaluation, the pattern resolution was such that the line-and-space pattern was formed without peeling up to the width of 10 μm. The contact angles of water and methylene iodide determined in conformity with Example 1 were 101.2° and 76.2°, respectively, and the surface energy was 19.6 dyn/cm.

EXAMPLE 4

2 g (6.8 mmol) of 1,3-bis(4-aminophenoxy)benzene, 1.71 g (2.9 mmol) of 1,3-diamino-5-benzyloxy-(1H,1H,2H,2H- heptadecafluoro)-1-decane, and 1.92 g (9.8 mmol) of 1,2,3,4-cyclobutanetetracarboxylic dianhydride were made to react in 31.9 g of NMP at room temperature for six hours, thereby obtaining a solution of a polyamic acid [b-3] having a number average molecular weight of 11,000 (l=10 as repeating units). The reduced viscosity of the polyamic acid was 0.3 dl/g (in N-methylpyrrolidone at a temperature of 30° C., at a concentration of 0.5 g/dl).

0.2 g of the above solution of the polyamic acid [b-3] was added into 20 g of the solution of the polyamic acid [a-1] in Example 1 (solid content ratio=99:1), and 5.0 g of NMP was further added thereinto to dilute the solution to a resin concentration of 12%. This solution was stirred at room temperature for one hour to obtain a uniform solution. The mixture obtained was filtered by the 0.4 µm filter to obtain a solution of the polyamic acid resin composition of the present invention.

Using the solution of the polyamic acid resin composition prepared, a uniform film was formed in a thickness of 2.0 µm in conformity with Example 1. As a result of the same evaluation, the pattern resolution was such that the line-and-space pattern was formed without peeling up to the width of 10 µm. The contact angles of water and methylene iodide determined in conformity with Example 1 were 105° and 79°, respectively, and the surface energy was 18.4 dyn/cm.

COMPARATIVE EXAMPLE 1

Using only the solution of the polyamic acid [a-1] in Example 1, a film was formed in a film thickness of 2.0 µm in conformity with Example 1. As a result of the same evaluation, the pattern resolution was such that the line-and-space pattern was formed without peeling up to the width of 10 µm. The contact angles of water and methylene iodide determined in conformity with Example 1 were 64.8° and 31.8°, respectively, and the surface energy was 44.8 dyn/cm.

COMPARATIVE EXAMPLE 2

5.52 g (51.0 mmol) of p-phenylenediamine, 3.39 g (9.6 mmol) of 4-octadecyloxy-1,3-diaminobenzene, and 18.02 g (60.0 mmol) of 3,4-dicarboxy-1,2,3,4-tetrahydro-1-naphthalenesuccinic dianhydride were made to react in 152 g of NMP at room temperature for six hours. The solution was diluted with NMP to a solid content of 6.0 wt %, and thereafter acetic anhydride and pyridine were added thereinto, followed by dehydration and ring closure reaction at 40° C. for two hours. This solution was poured into methanol and the resultant solution was subjected to filtration and drying, thereby obtaining polyimide powder having a number average molecular weight of 17,000 (l=38 as repeating units). The reduced viscosity of the polyimide was 0.6 dl/g (in N-methylpyrrolidone at a temperature of 30° C., at a concentration of 0.5 g/dl). The polyimide powder was dissolved in NMP to obtain a polyimide solution [c] having a resin concentration of 12%.

The polyimide solution [c] was mixed with the solution of polyamic acid [a-1] in Example 1 at a solid content ratio of 99:1, and the mixture was diluted with NMP to a resin concentration of 12%. This solution was stirred at room temperature for one hour to obtain a uniform solution. The mixture obtained was filtered by the 0.4 µm filter to obtain a solution of the mixed resin composition.

Using the solution of the mixed resin composition prepared, a film was formed in a thickness of 2.0 µm in conformity with Example 1. As a result of the same evaluation, the pattern resolution was such that the line-and-space pattern was formed without peeling up to the width of 10 µm. The contact angles of water and methylene iodide determined in conformity with Example 1 were 73.1° and 38.0°, respectively, and the surface energy was 40.8 dyn/cm.

COMPARATIVE EXAMPLE 3

17.2 g (47.5 mmol) of 2,2-bis(3-amino-4-methylphenyl) hexafluoropropane and 9.81 g (50.0 mmol) of 1,2,3,4-cyclobutanetetracarboxylic dianhydride were made to react in 64.5 g of NMP at room temperature for 24 hours to obtain a solution of a polyamic acid [d] having a number average molecular weight of 40,000 (k=72 as repeating units). The reduced viscosity of the polyamic acid was 0.7 dl/g (in N-methylpyrrolidone, at a temperature of 30° C., at a concentration of 0.5 g/dl). The solution of the polyamic acid obtained was filtered by the 0.4 µm filter to obtain a solution of the polyamic acid resin composition.

Using the solution of the polyamic acid resin composition prepared, a film was formed in a thickness of 2.0 µm in conformity with Example 1. As a result of the same evaluation, the pattern resolution was such that the line-and-space pattern was formed without peeling up to the width of 10 µm. The contact angles of water and methylene iodide determined in conformity with Example 1 were 70.8° and 39.6°, respectively, and the surface energy was 40.5 dyn/cm.

COMPARATIVE EXAMPLE 4

13.8 g (26.6 mmol) of 2,2-bis[4-(4-aminophenoxy) phenyl] hexafluoropropane, 10.0 g (40.2 mmol) of 1,3-bis (3-aminopropyl)-1,1,3,3-tetramethyldisiloxane, and 12.8 g (65.5 mmol) of 1,2,3,4-cyclobutanetetracarboxylic dianhydride were made to react in 207 g of NMP at room temperature for six hours, thereby obtaining a solution of a polyamic acid [e] having a number average molecular weight of 10,000 (k=18 as repeating units). The reduced viscosity was 0.4 dl/g (in N-methylpyrrolidone, at a temperature of 30° C., at a concentration of 0.5 g/dl).

The solution of the polyamic acid [e] was mixed with the solution of the polyamic acid [a-1] in Example 1 at a solid content ratio of 99:1, and the mixture was diluted with NMP to a resin concentration of 12%. This solution was stirred at room temperature for one hour to obtain a uniform solution. The mixture obtained was filtered by the 0.4 µm filter to obtain a solution of the polyamic acid resin composition.

Using the solution of the polyamic acid resin composition prepared, a film was formed in a thickness of 2.0 µm in conformity with Example 1. As a result of the same evaluation, the pattern resolution was such that the line-and-space pattern was formed without peeling up to the width of 10 µm. The contact angles of water and methylene iodide determined in conformity with Example 1 were 78.3° and 42.9°, respectively, and the surface energy was 38.1 dyn/cm.

Industrial Applicability

The polyamic acid film made from the composition of the present invention can undergo etching with an alkali aqueous solution through the use of a positive type photoresist; and, through a process of exposure with a mask having a predetermined pattern, development, and subsequent thermal imidization, a polyimide resin with a relief pattern of microscopic shape and high dimensional precision can be obtained readily with good adhesion to a substrate.

Since the polyimide resin has a low surface energy in the upper part of film, it is suitable for use of a bank adapted to the ink jet method in liquid crystal displays and EL displays.

Furthermore, since the components [a] and [b] of the present invention both are polyamic acids, they demonstrate moderate miscibility with one another and it is easy to adjust the ratio of components, as compared with cases where different kinds of resins are blended or cases where a surfactant is added to resin.

What is claimed is:

1. A polyamic acid resin composition for the formation of a bank, which comprises:

a polyamic acid having repeating units represented by formula

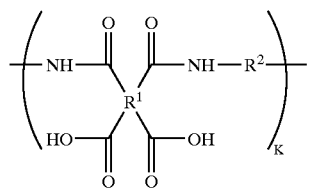

(1)

wherein $R^1$ is a tetravalent organic group derived from a tetracarboxylic acid or a derivative thereof, $R^2$ is a bivalent organic group derived from a diamine, and k is an integer[)], and having a reduced viscosity ranging from 0.05 to 5.0 dug [(] as determined in N-methylpyrrolidone at a temperature of 30° C., at a concentration of 0.5 gl/g[)]; and a polyamic acid (b) having repeating units represented by formula

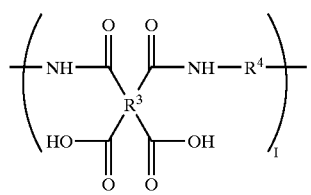

(2)

wherein $R^3$ is a tetravalent organic group derived from a-tetracarboxylic acid compound or a derivative thereof, $R^4$ is a bivalent organic group derived from a diamine compound, from 1 to 100 mol % of $R^4$ has one or more fluorine-containing alkyl groups with a carbon number of at least 2, and 1 is an integer[)], and having a reduced viscosity ranging from 0.05 to 5.0 dl/g [(] in N-methylpyrrolidone at a temperature of 30° C., at a concentration of 0.5 g/dl[)]; wherein the content of the polyamic acid (b) ranges from 0.1 to 30 wt % based on the total amount of the polyamic acid (a) and the polyamic acid (b).

2. The polyamic acid resin composition according to claim 1, wherein $R^1$ in formula (1) is a tetravalent organic group derived from 1,2,3,4-cyclobutanetetracarboxylic acid or a derivative thereof.

3. The polyamic acid resin composition according to claim 1 or 2, wherein $R^3$ in formula (2) is a tetravalent organic group derived from 1,2,3,4-cyclobutanetetracarboxylic acid or a derivative thereof.

4. The polyamic acid resin composition according to claim 1, wherein, through a process of applying a positive type resist onto a film of the polyamic acid resin composition, exposing the resist and film to light through a mask, performing development thereof with an alkali developer, removing the resist, and heating the film until it converts into a polyimide resin, the upper part of the unexposed portion of the polyimide resin film has a surface energy of at most 35 dyn/cm.

5. The polyamic acid resin composition according to claim 1, wherein, through a process of applying a positive type resist onto a film of the polyamic acid resin composition, exposing the resist and film to light through a mask, performing development thereof with an alkali developer, removing the resist, and heating the film until it turns into a polyimide resin, the upper part of the unexposed portion of the polyimide resin film has a contact angle with water of at least 80°.

6. The polyamic acid resin composition according to claim 1, wherein the tetracarboxylic acid derivative which provides the tetravalent organic groups $R^1$ and $R^3$ of the polyamic acids of formulas (a) and (b) is an aromatic tetracarboxylic dianhydride selected from the group consisting of pyromellitic dianhydride, 3,3',4,4'-biphenyltetracarboxylic dianhydride, 3,3',4,4'-benzophenonetetracarboxylic dianhydride, 3,3',4,4'-diphenyl ether tetracarboxylic dianhydride, 2,2-bis(3,4-dicarboxyphenyl)hexafluoropropane dianhydride, and 3,3',4,4'-diphenyl sulfone tetracarboxylic dianhydride.

7. The polyamic acid resin composition according to claim 1, wherein the tetracarboxylic acid derivative which provides the tetravalent organic groups $R^1$ and $R^3$ of the polyamic acids of formulas (a) and (b) is an alicyclic tetracarboxylic dianhydride selected from the group consisting of 1,2,3,4-cyclobutanetetracarboxlic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,3,5-cyclohexanetetracarboxylic dianhydride, 3,4-dicarboxy-1,2,3,4-tetrahydro-1-naphthalenesuccinic dianhydride, 2,3,5-tricarboxy-2-cyclopentaneacetic dianhydride, bicyclo[2.2.2]oct-7-ene-2,3,5,6-tetracarboxylic dianhydride, 2,3,4,5-tetrahydrofurantetracarboxylic dianhydride and 3,5,6-tricarboxy-2-norbornaneacetic dianhydride or 1,2,3,4-butanetetracarboxylic dianhydride as an aliphatic tetracarboxylic dianhydride.

8. The polyamic acid resin composition according to claim 1, wherein the diaxnine compound which provides the divalent organic group $R^2$ of the polyamic acid of formula (a) is p-phenylenediamine, m-phenylenediamine, 4,4-methylene-bis(2,6.ethylaniline), 4,4'-methylene-bis(2isopropyl-6-methylaniline), 4,4'-methylene-bis(2,6-diisopropylaniline), 2,4,6-trimethyl-1,3-phenylenediamine, 2,4,5,6-tetramethyl-1,4-phenylenediamine,o-toluidine, m-toluidine, 3,3',5,5'-tetramethylbenzidine, bis[4-(3aminophenoxy)phenyl]sulfone, 2,2-bis[4-(3-aminophenoxy)phenyl]propane, 2,2-bis[4-(3-aminophenoxy)phenyl]hexafluoropropane, 4,4'-diamino-3,3'-dimethyldicyclohexylmethane, 4,4'-diaminodiphenyl ether, 3,4-diaminodiphenyl ether, 4,4'-diaminodiphenylmethane, 2,2-bis(4anilino)hexafluoropropane, 2,2bis(3anilino)hexafluoropropane, 2,2-bis(3-amino-4-toluyl)hexafluoropropane, 1,4bis(4aminophenoxy)benzene, 1,3-bis(4-aminophenoxy)benzene, bis[4-(4aminophenoxy)Phenyl]sulfone, 2,2-bis[4-(4-aminophenoxy)Phenyl]propane and 2,2-bis[4(4aminophenoxy)phenyl]hexafluoropropane.

9. The polyamic acid resin composition according to claim 1, wherein the diamine compound which provides the divalent organic group $R^4$ component of the polyamic acid of formula (b) that contains the fluorine-containing alkyl group is 4-trifluoroethyl-1,3-diaminobenzene, 4-perfluorohexyl-1,3-diaminobenzene, 4-perfluorooctyl-1,3diaminobenzene, 4-perfluorohexyl-1,3-diaminobenzene, 5-(2,2,3,3,3-pentafluoropropyl-1-oxymethyl)-1,3-diaminobenzene, 5-(1H,1H,2H,2H-heptadecafluorodecyl-1-oxymethyl)-1,3diaminobenzene, 4perfluorodecyl-1, 3diaminobenzene, 2,2,3,3,3pentafluoropropyl-3,5-diaminobenzoate, 1H, 1H,2H,2H-heptadecafluorodecyl-3,5-diaminobenzoate and 4-(4-perfluorooctylphenoxy)-1,3diaminobenzene.

10. The polyamic acid resin composition according to claim 1, wherein the content of bivalent radicals that are derived from diamine compounds containing one or more fluorine-containing alkyl groups with a carbon number of at least 2 that constitute radical $R^4$ ranges from 25 to 75 mol %.

11. The polyamic acid resin composition according to claim 1, wherein the diamine compound which provides the divalent organic group $R^2$ of the polyamic acid of formula (a) is a siloxane-containing diaxnine of the formula:

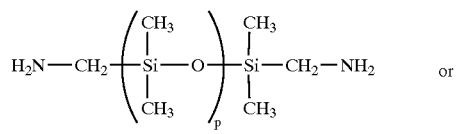 or

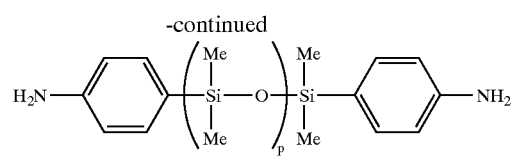

wherein p is an integer from 1 to 10.

12. The polyamic acid resin composition according to claim 1, wherein the polyamic acid of formula (a) has a reduced viscosity ranging from 0.2 to 2.0 dl/g.

13. The polyamic acid resin composition according to claim 1, wherein the polyamic acid of formula (b) has a reduced viscosity ranging from 0.1 to 1.5 dl/g.

* * * * *